(12) United States Patent
Lin et al.

(10) Patent No.: US 7,256,461 B2
(45) Date of Patent: Aug. 14, 2007

(54) ELECTROSTATIC DISCHARGE (ESD) PROTECTION DEVICE

(75) Inventors: Shi-Tron Lin, Taipei (TW); Wei-Fan Chen, Taichung (TW)

(73) Assignee: Winbond Electronics Corp. (TW)

( * ) Notice: Subject to any disclaimer, the term of this patent is extended or adjusted under 35 U.S.C. 154(b) by 82 days.

(21) Appl. No.: 10/696,526

(22) Filed: Oct. 29, 2003

(65) Prior Publication Data

US 2004/0124472 A1 Jul. 1, 2004

(30) Foreign Application Priority Data

Dec. 30, 2002 (TW) .............................. 91137925 A (51) Int. Cl.
*H01L 23/62* (2006.01)
(52) U.S. Cl. ...................... 257/360; 257/361; 257/355
(58) Field of Classification Search ................ 257/360, 257/361, 355
See application file for complete search history.

(56) References Cited

U.S. PATENT DOCUMENTS

| 5,248,892 | A | 9/1993 | Van Roozendaal et al. |
| 5,721,439 | A | 2/1998 | Lin |
| 6,046,087 | A | 4/2000 | Lin et al. |
| 6,064,095 | A | 5/2000 | Fu |
| 6,153,913 | A | 11/2000 | Hsu et al. |
| 6,157,065 | A | 12/2000 | Huang et al. |
| 6,236,073 | B1 | 5/2001 | Hsu |
| 6,465,308 | B1 * | 10/2002 | Cheng et al. ................ 438/289 |
| 6,573,568 | B2 * | 6/2003 | Lin et al. .................... 257/365 |

* cited by examiner

*Primary Examiner*—Sara Crane
(74) *Attorney, Agent, or Firm*—Anthony R. Barkume, P.C.

(57) ABSTRACT

The present invention provides a combined FOX and poly gate structure, for effectively reducing the trigger voltage of a conventional field device, for improving the robustness of a NMOS transistor of a small drive I/O circuit, and for improving the ESD performance of a stack-gate voltage tolerant I/O.

22 Claims, 10 Drawing Sheets

ELECTROSTATIC DISCHARGE (ESD) PROTECTION DEVICE

FIELD OF THE INVENTION

The present invention is related to an electrostatic discharge protection device, and more particularly to the electrostatic discharge protection device for the IC pin design.

BACKGROUND OF THE INVENTION

I. Multi-Gate-Fingers NMOSFET and the Issue:

An NMOSFET is a very effective ESD protection device. In one application, with the gate connected to a gate-driving signal, the NMOSFET is used as the pull down device of a CMOS buffer to drive an output voltage. In a second application, with the gate electrically connected to the ground, the NMOSFET is used to protect an input pin or power bus during an ESD event.

In a PS (Positive-Voltage-to-VSS) mode ESD event, a positive ESD transient voltage applied to an IC pin while a VSS power pin is at ground potential, the protection of an NMOSFET heavily depends on the snap-back mechanism for conducting large amount of ESD current between the drain and source. To start, the high electric field at the drain junction causes impact ionization, which generates both minority and majority carriers. The minority carriers flow toward the drain contact and the majority carriers flow toward the substrate/pwell contact causing a local potential build up in the current path in pwell. When the local substrate potential is 0.6V higher than the adjacent n+ source potential, the source junction becomes forward biased. The forward biased source junction injects minority carriers (electrons) into the pwell, and those carriers eventually reach the drain junction to further enhance the impact ionization (see Ref. 1b). And as a continuous loop the MOSFET gets into a low impedance (snap back) state to conduct large amount of ESD current.

Figure 1A:
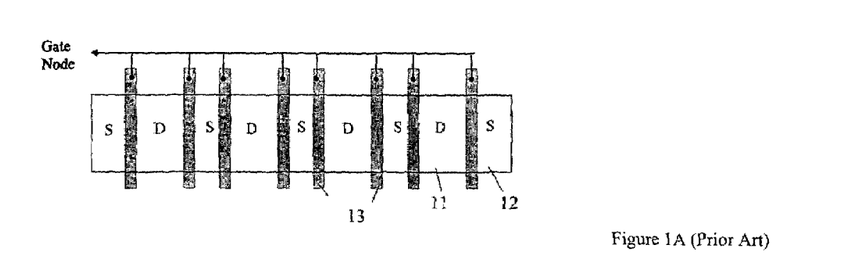
FIG. 1A and FIG. 1B show a conventional multi-finger NMOS structure.
Figure 1B:
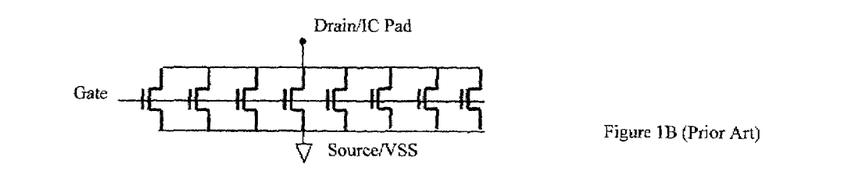

In a multi-finger NMOS structure as shown in FIG. 1A and FIG. 1B, not all gate fingers may turn on during an ESD event. This is because the first few gate finger having turned on quickly get into a snap-back low-impedance condition. It reduces the drain terminal 11 to source terminal 12 voltage to a transient voltage less than the trigger voltage of the NMOS device. This potentially prevents other gate fingers from turning on. Therefore, with only partial number of gate fingers turned on to absorb the ESD energy, the size of the NMOSFET is effectively reduced and the ESD performance degrades.

When a gate finger is triggered in an ESD event, the entire finger turns on. This is due to a cascading effect that a local source junction in a forward biasing state will inject lots of carriers into the substrate to flow toward the drain junction, which in turn generates more minority carriers (due to impact ionization) flowing back toward the p+ guard ring to raise the adjacent pwell potential. Therefore, the adjacent source region is also turned into a forward bias state. With this cascading effect, the entire gate finger turns on into a snap back condition.

Figure 2A:
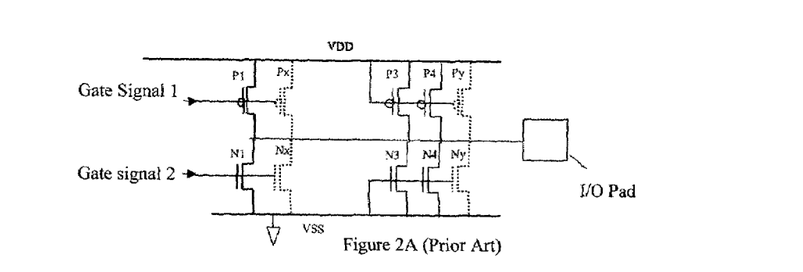
FIG. 2A and FIG. 2B show a conventional pull-down NMOSFET comprising a number of gate elements.
Figure 2B:
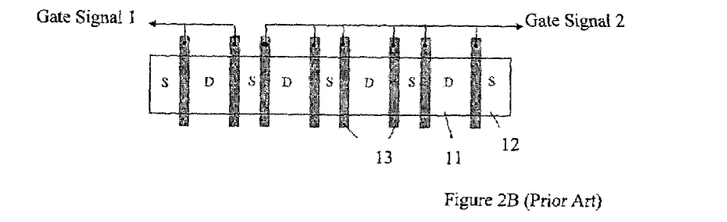

Prior art MOSFET-based I/O (Input/Output) structures with self-ESD protection typically including a number of NMOSFET and PMOSFET transistors. As shown in FIGS. 2A and 2B, the pull-down NMOSFET may comprises a number of gate elements, with some connected to a first gate signal for the output transistor portion, and some connected to the VSS bus/Ground as the input protection ESD structure. Similarly, the pull-up PMOSFET may comprise a number of gate elements, with some connected to a second gate signal for the output transistor portion, and some connected to the VDD bus as the input protection ESD structure. In the prior-art methods, a gate element formed of a polysilicon element is typically either coupling to a gate signal or to a power bus.

Figure 3A:
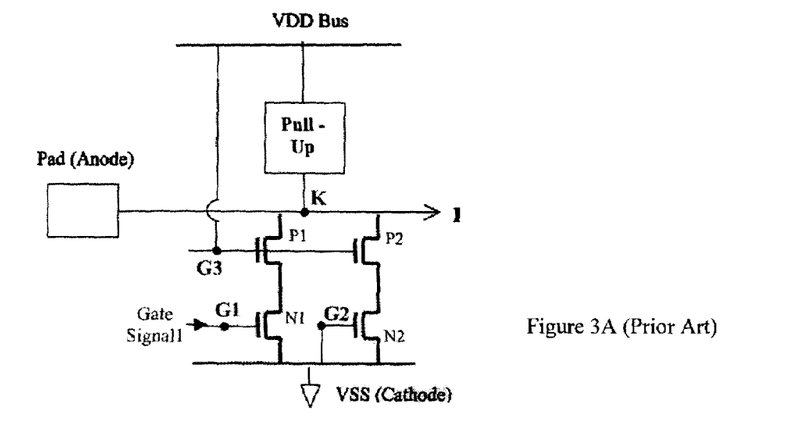
FIG. 3A shows a conventional pull-down portion of a well known voltage-tolerant I/O and ESD protection circuit.
Figure 3B:
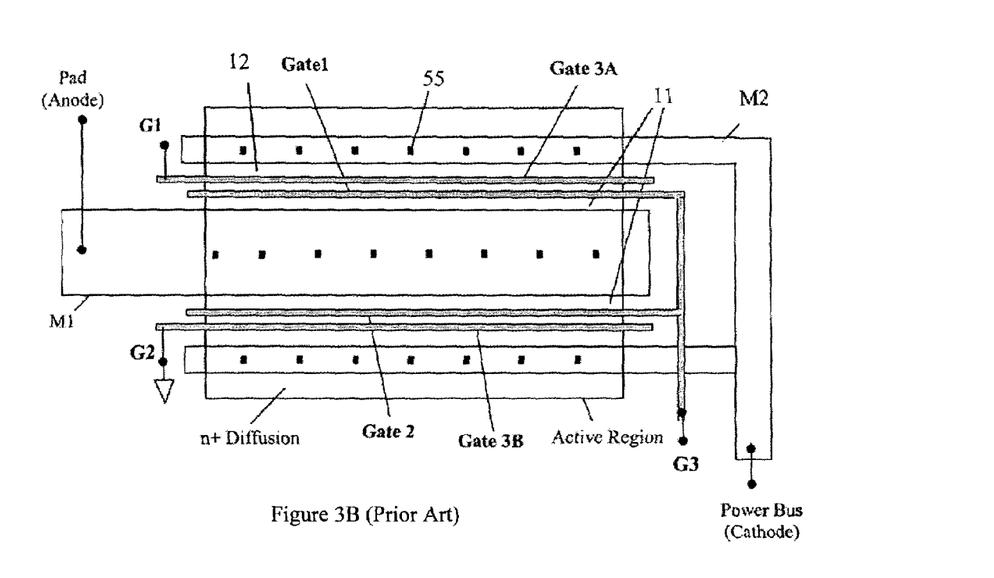
FIG. 3B shows an exampled layout for a stack-gate configuration for a pull-down I/O circuit.

FIG. 3A shows the pull-down portion of a well known voltage-tolerant I/O and ESD protection circuit. As an example, VDD is at 3.3V and the NMOS gate oxide can withstand only up to 3.6V. But based on a stack-gate configuration, the voltages across each gate oxides of pull-down NMOS-transistors does not exceed 3.3V, even though a 5-volt signal appears at the pad. This is known as a 5V-tolerant design based on a 3.3V MOS transistors. However, the ESD performance of such 5V tolerant I/O circuit are typically not satisfactory due to shorter contact to gate spacing and larger drain-to-source spacing (less efficient bipolar for ESD snap-back mechanism). FIG. 3B shows an exampled layout for a stack-gate configuration for a (pull-down) I/O circuit.

Figures 4A, 4B:
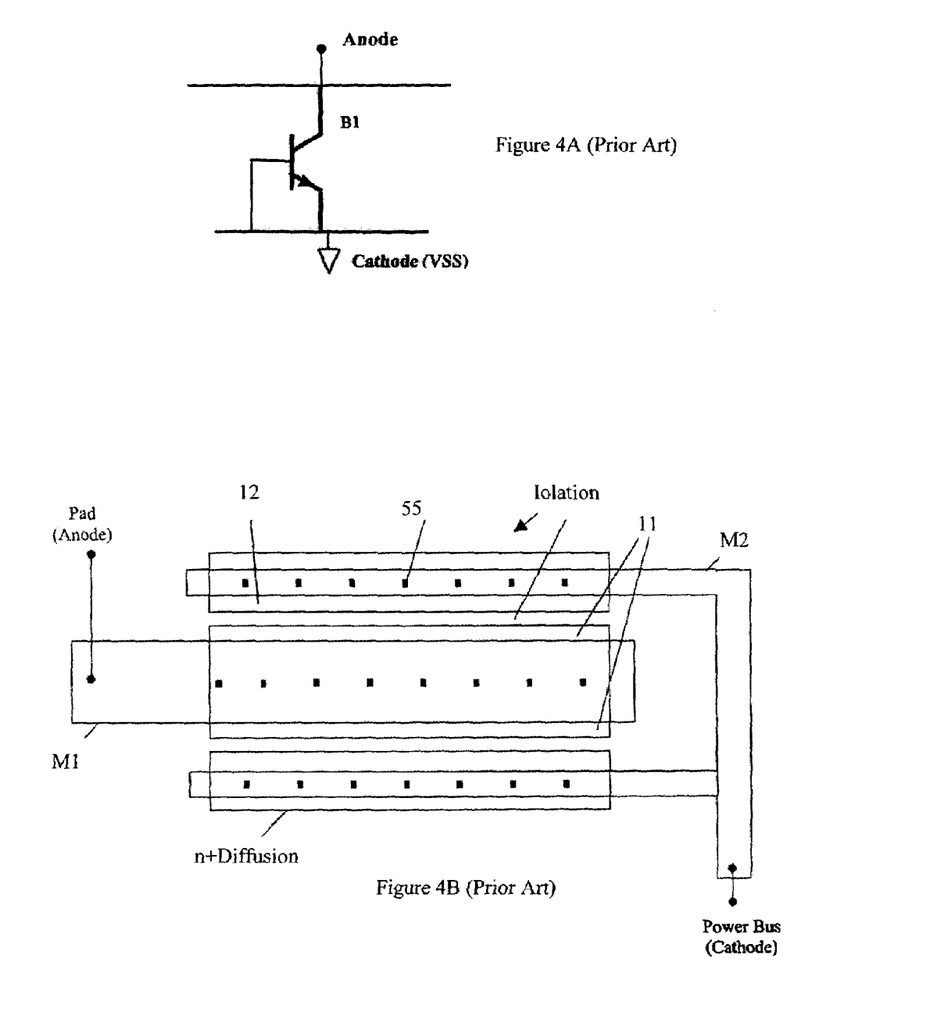
FIG. 4A shows another ESD protection device known as a field device or a lateral bipolar device.
FIG. 4B shows an exampled layout of a field device.

FIG. 4A shows another ESD protection device known as a field device, or a lateral bipolar device. And FIG. 4B shows an exampled layout of a field device, with a channel region formed under a field oxide stripe for separating an n+ source regions. A filed device is a viable option as a primary ESD protection device, a minor drawback is that the trigger voltage is typically a little bit higher than a GGNMOS (Ground-Gate NMOS) or a GCNMOS (Gate-Couple NMOS) transistor.

SUMMARY OF THE INVENTION

The objective of the present invention is to provide a combined FOX and poly gate structure for effectively reducing the trigger voltage of a conventional field device, for improving the robustness of a NMOS transistor of a small drive I/O circuit, and for improving the ESD performance of a stack-gate voltage tolerant I/O.

According to the present invention, an electrostatic discharge (ESD) protection device comprises:

a semiconductor bulk of a first conductivity type;

a first doped region of a second conductivity type formed in the semiconductor bulk;

a second doped region of a second conductivity type formed in the semiconductor bulk;

a channel region formed between the first doped region and the second doped region;

a first gate segment formed over a first part of the channel region; and a first-oxide stripe formed over a second part of the channel region; wherein a first part of the first gate segment at least partially overlaps the first field-oxide stripe.

In accordance with one aspect of the present invention, wherein the first gate segment and the first field-oxide stripe are substantially collinear.

In accordance with one aspect of the present invention, wherein the first gate segment comprises a polysilicon element over an oxide layer.

In accordance with one aspect of the present invention, further comprises a plurality of islands formed over the bulk and being encircled by the first doped region.

In accordance with one aspect of the present invention, wherein the plurality of islands comprises a first and second arrays of islands; the first array of islands comprises polysilicon-over-oxide islands; and the second array of islands comprises field-oxide islands.

In accordance with one aspect of the present invention, wherein the first array of islands is closer to the channel region than the second array of islands.

In accordance with one aspect of the present invention, further comprises a second gate segment formed over a third part of the channel region;

In accordance with one aspect of the present invention, wherein the second and third parts form a second continuous portion of the channel.

In accordance with one aspect of the present invention, wherein the first doped region couples to a pad.

In accordance with one aspect of the present invention, wherein the second doped region couples to a power bus.

According to the present invention, an electrostatic discharge (ESD) protection device comprises:

a semiconductor bulk of a first conductivity type;

a first doped region of a second conductivity type formed in the semiconductor bulk;

a second doped region of a second conductivity type formed in the semiconductor bulk;

a channel region formed between the first and the second doped regions;

the channel region comprising a split-channel region and a non-split-channel region;

the split-channel region including a first and a second sub-channel regions spaced apart from each other; wherein the first sub-channel region being adjacent to the first doped region and the second sub-channel region being adjacent to the second doped region;

a first gate segment formed over the first sub-channel region;

a second gate segment formed over the second sub-channel region;

A field-oxide stripe formed over the non-split-channel region; and the first and the second gate segments form a stack-gate structure.

In accordance with one aspect of the present invention, wherein the first and the second gate segments are substantially parallel to each other.

In accordance with one aspect of the present invention, wherein the first gate segment, the second gate segment and the field-oxide stripe are substantially parallel to each other.

In accordance with one aspect of the present invention, wherein the split channel region is connected to the non-split channel region to form a continuous channel region.

In accordance with one aspect of the present invention, wherein the first gate segment comprises a polysilicon element over an oxide layer.

In accordance with one aspect of the present invention, wherein the second gate segment comprises a polysilicon element over an oxide layer.

In accordance with one aspect of the present invention, wherein the first gate segment have a first part overlapping a field-oxide extension segment; and the second gate segment have a second end overlapping the field-oxide extension segment.

In accordance with one aspect of the present invention, further comprises a plurality of islands formed over the bulk and being encircled by the first doped region.

In accordance with one aspect of the present invention, wherein the plurality of islands comprises a plurality arrays of islands.

In accordance with one aspect of the present invention, wherein the first doped region coupling to a pad.

In accordance with one aspect of the present invention, wherein the second doped region coupling to a power bus.

According to the present invention, an electrostatic discharge (ESD) protection device, comprises:

a semiconductor bulk of a first conductivity type;

a first doped region of a second conductivity type formed in the semiconductor bulk;

a second doped region of a second conductivity type formed in the semiconductor bulk;

a channel region formed between the first and the second doped regions;

A first and a second arrays of islands formed over the bulk and being encircled by the first doped region; wherein the first array of islands comprising polysilicon-over-oxide islands;

the second array of islands comprising field-oxide islands; and the first array of islands being closer to the channel region than the second array of islands.

The present invention may best be understood through the following description with reference to the accompanying drawings, in which:

DETAILED DESCRIPTION OF THE PREFERRED EMBODIMENT

Figure 5A:
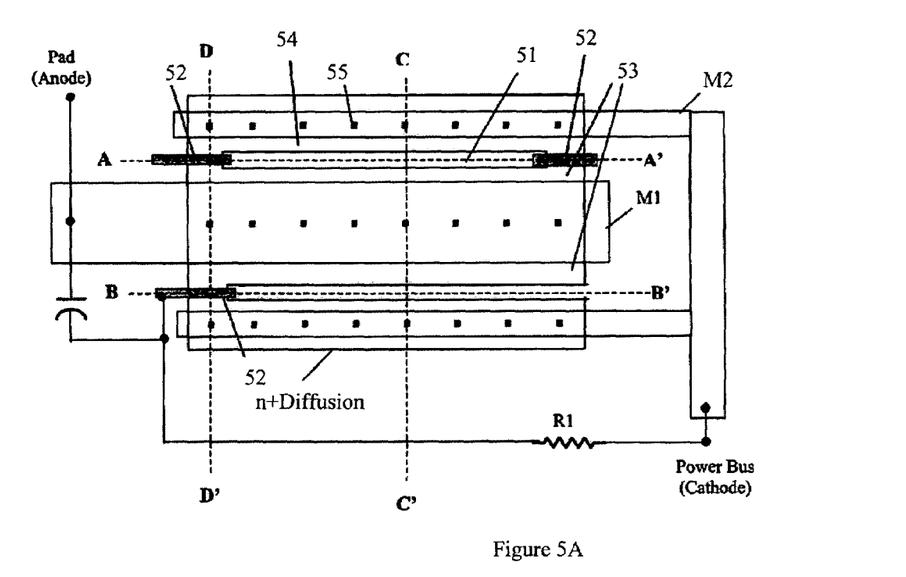
FIG. 5A shows the poly-silicon gate element(s) according to the present invention.
Figure 5B:
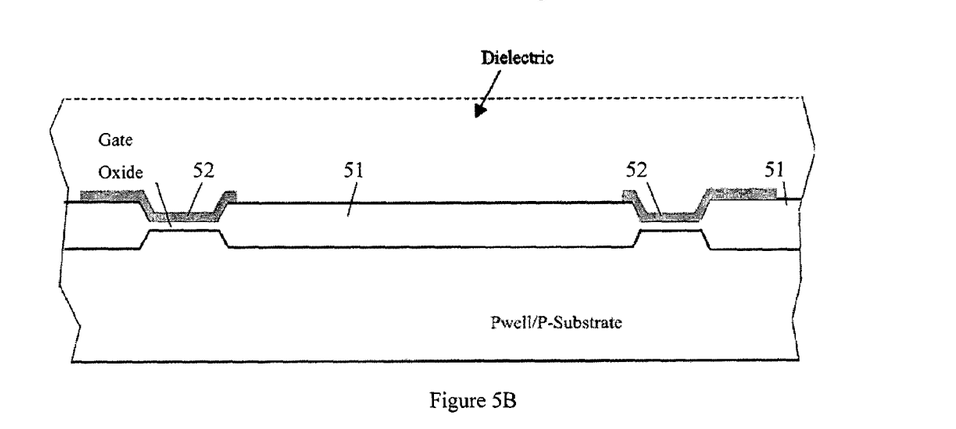
FIGS. 5B,5C,5D, and 5E show the cross-section view of FIG. 5A.
Figure 5C:
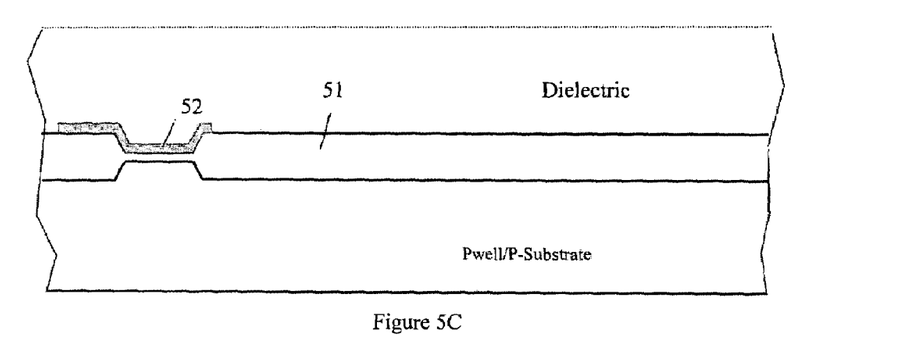
Figure 5D:
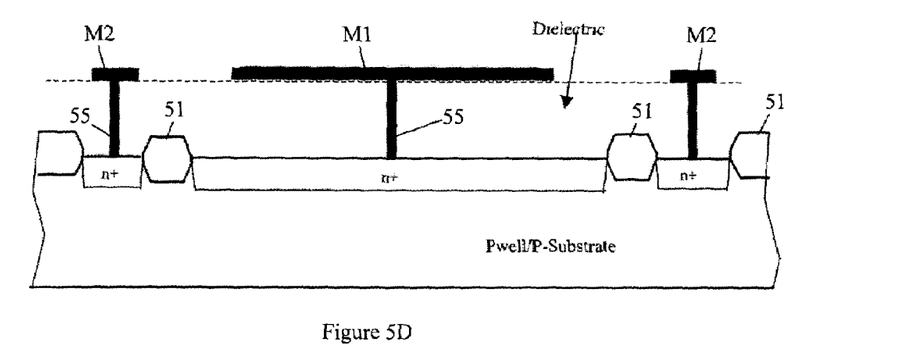
Figure 5E:
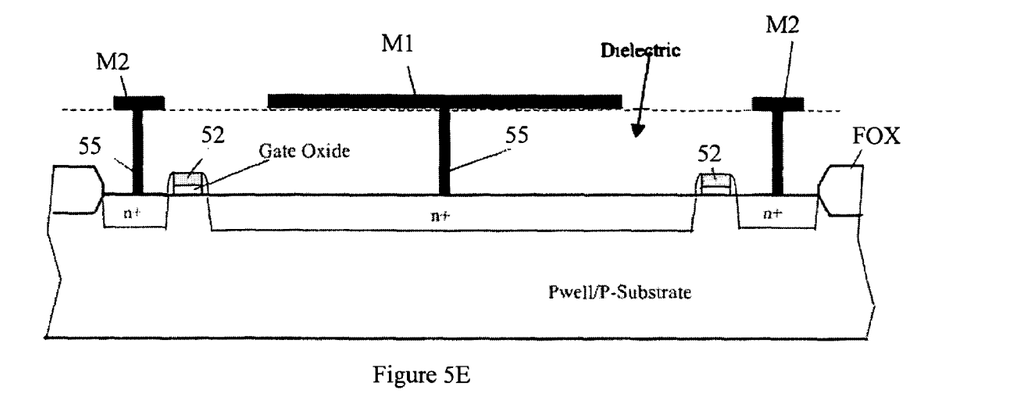

1. Improved Field-Device ESD Protection Element With Reduced Trigger Voltage:

As illustrated in FIG. 5A, poly-silicon gate element(s) 52 being formed as an extension at one or two ends of a field oxide stripe 51. A channel region is formed under the continuous stripe of overlapping filed-oxide and poly-silicon-gate elements 52, and sandwitched between a continuous drain diffusion edge and a continuous source diffusion edge.

The combined FOX stripe 51 and poly-gate element 52 form an "effective gate finger" between the drain 53 and source diffusion regions 54. When the poly-gate-element is triggered in an ESD event, the entire FOX/poly-gate-element finger turns on. This is due to a cascading effect that a local source junction in a forward biasing state will inject lots of carriers into the substrate to flow toward the drain junction, which in turn generates more minority carriers (due to impact ionization) flowing back toward the p+ guard ring to raise the adjacent pwell potential. Therefore, the adjacent source region is also turned into a forward-bias state. With this cascading effect, the snap back occurring at the poly-gate element 52 quickly cascading down along the FOX stripe and thus the entire FOX/poly-gate-element finger turns on into a snap back condition.

As shown in FIG. 5A, the two gate elements 52 can be the same node connecting to the same gate voltage or gate signal. Alternatively, they can be different nodes connecting to different gate voltages or signals.

FIGS. 5B, 5C, 5D and 5E show the cross-section view of FIG. 5A device along the dotted lines A-A',B-B',C-C' and D-D'.

2. Small-Drive NMOS Transistor:

As was shown in FIGS. 2A and 3B prior art, for small-drive NMOS transistors, typically additional dummy (ground-gate) NMOS fingers are used in conjunction with the NMOS output transistor to assure adequate total NMOS size for ESD protection. The draw back is that not all NMOS are turned on simultaneously and thus the ESD performance is less consistent.

Figure 6A:
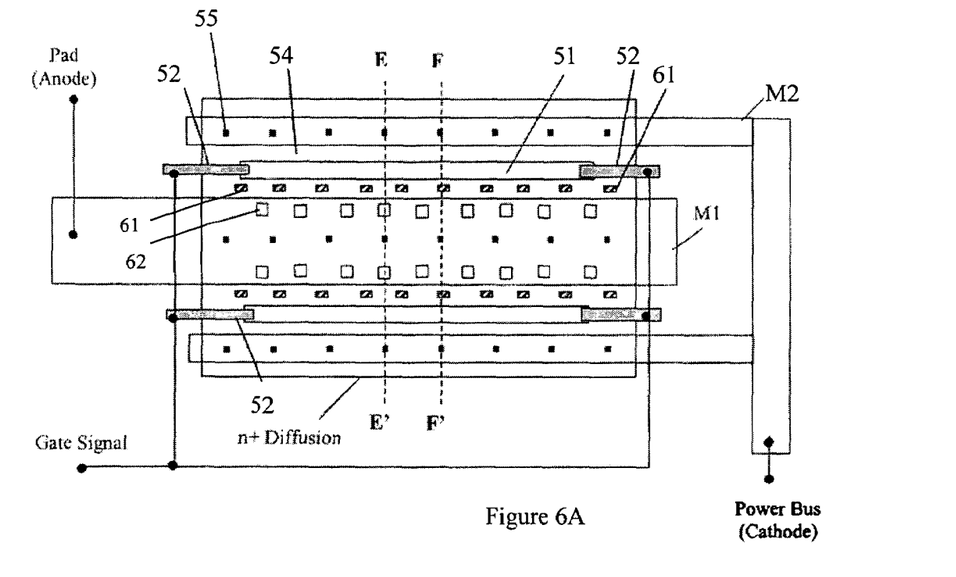
FIG. 6A show the small (short) NMOS gate elements (for the small-drive NMOS transistor) according to the present invention.

As shown in FIG. 6A, the small (short) NMOS gate elements (for the small-drive NMOS transistor) can be placed at one or two ends of a FOX/poly-gate-element stripe. Once the poly-gate element 52 is triggered, the entire FOX/poly-gate-element stripe, as an effective gate finger, quickly turns into snap back.

Since during an ESD event, most of the heat is generated at the center portion of a gate finger, preferably but not as a required condition, by placing the FOX stripe substantially at the center position of the "FOX/poly-gate-element" finger reduces the chances of gate-oxide (of the poly-gate element) rupture during the ESD event.

A preferred "islands" placement was shown in the drain region 53, in that, an array of FOX islands 61 and an array of floating poly-islands 62 are placed along a stripe of drain region. As a preferred option, the array of poly islands are closer to the gate and channel than the array of the FOX islands. In this arrangement, the contact 55 to gate spacing can be reduced from a traditional 5 μm down to 3 to 4 μm.

The combined arrays of FOX and poly island 62 structure enjoys the advantage that the trigger voltage is the lower of either with the FOX or poly islands 62, regardless of what process technology is used. And with FOX closer to the contact where the high ESD voltage comes in, less chance for damaging the gate oxide of a poly island.

Figure 6B:
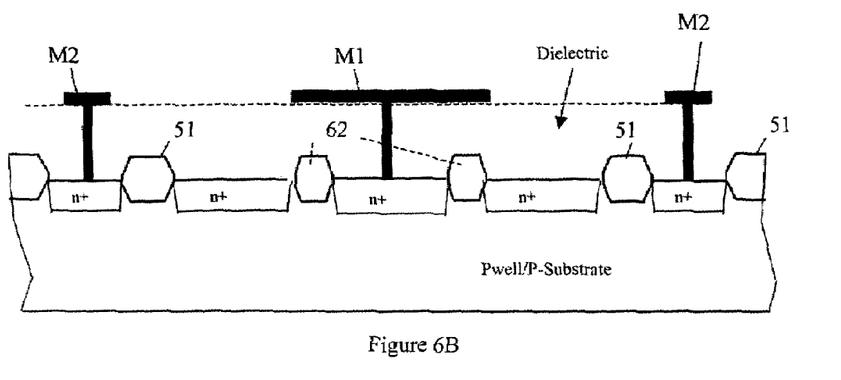
FIGS. 6B and 6C show the cross-section view of FIG. 6A.
Figure 6C:
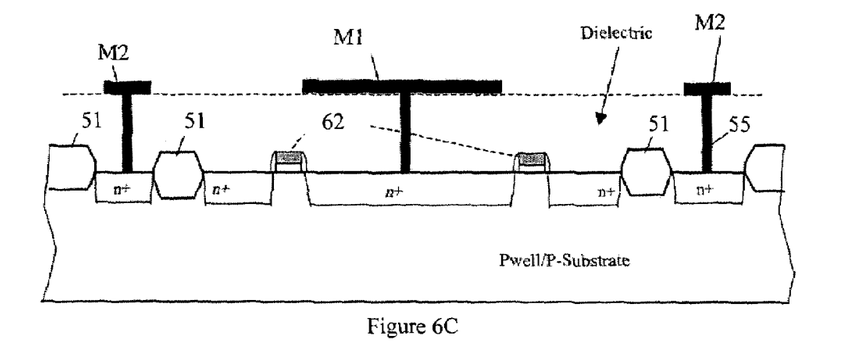

FIGS. 6B and 6C show the cross-section view of FIG. 6A device along the dotted lines E-E' and F-F'.

3. NMOS Gate Fingers With Preferred Island Structures.

Figure 7A:
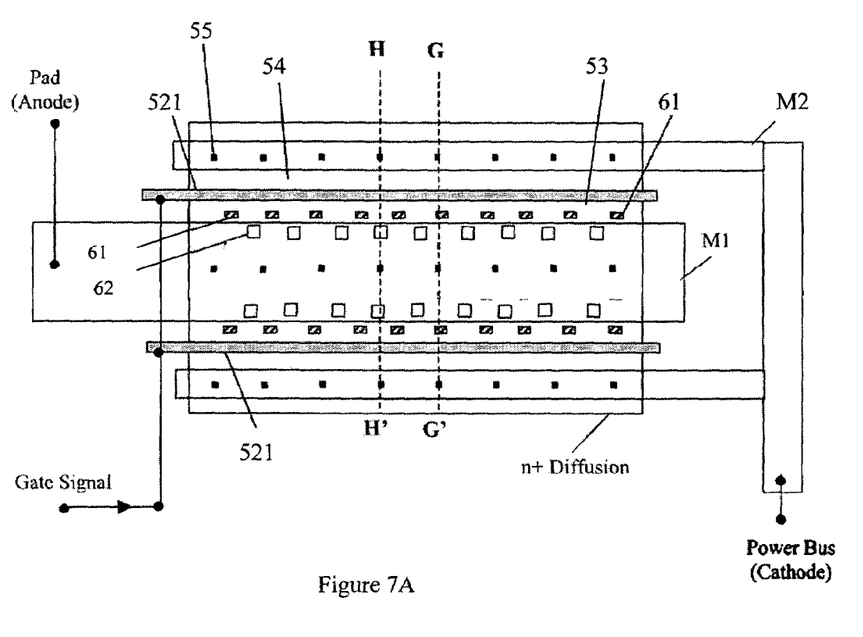
FIG. 7A shows another optimized island structure for NMOS transistor I/O or ESD protection device according to the present invention.

FIG. 7A shows another optimized island structure for NMOS transistor I/O or ESD protection device. An array of FOX islands 61 and a first array of floating poly-islands are placed along a stripe of drain region 53. As a preferred option, the first array of poly islands 62 are closer to the gate 521 and channel than the array of the FOX islands 62. As another option, a second array of poly islands 62 can be disposed between the array of FOX islands 61 and the drain contacts 55.

Figure 7B:
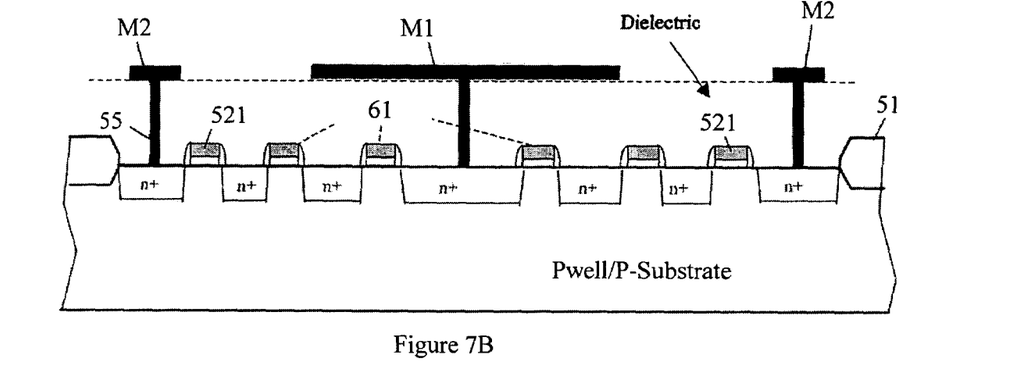
FIGS. 7B and 7C show the cross-section view of FIG. 7A.
Figure 7C:
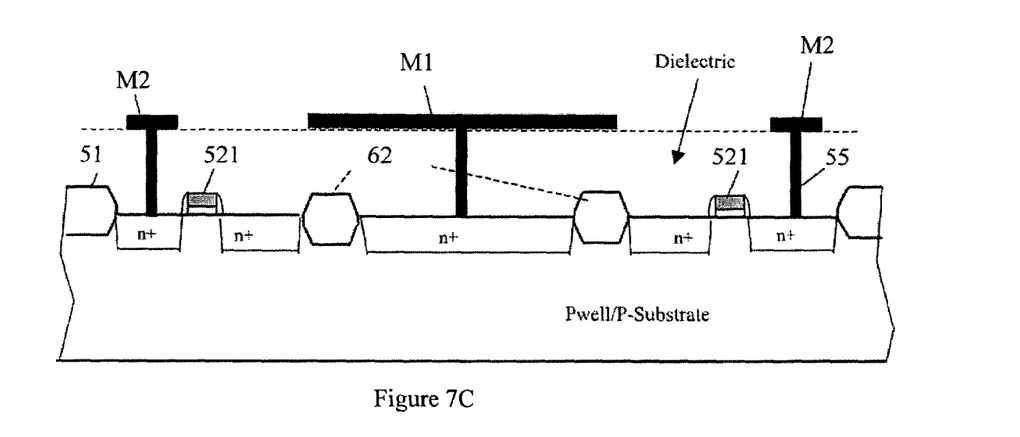

FIGS. 7B and 7C show the cross-section view of FIG. 7A device along the dotted lines G-G' and H-H'.

Figure 8:
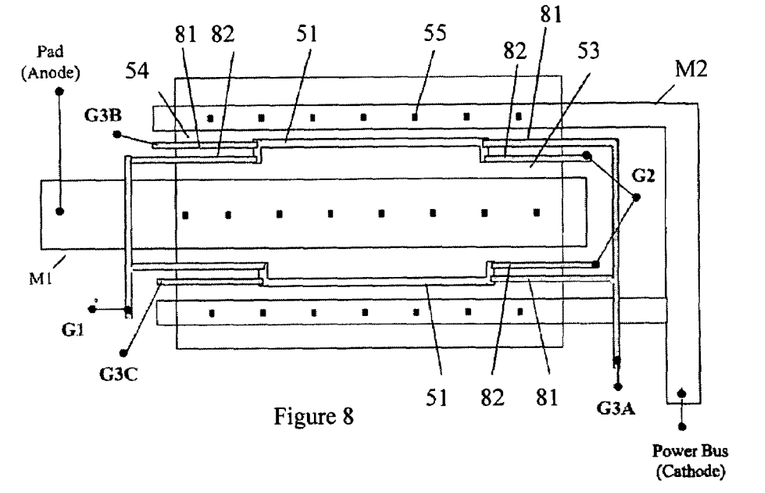
FIG. 8 shows the stacked-gate elements and a FOX stripe form a continuous stripe of gate structure according to the present invention.

4. Voltage Tolerant I/O for ESD Protection:

As was shown in FIG. 8, stacked-gate elements (81,82) and a FOX stripe 51 form a continuous stripe of gate structure. The ESD trigger will initially taking place at the poly-gate to drain edge, and cascading along the entire FOX/stacked-gate-element finger. The ESD improvement is due to FOX stripe functions as the effective gate finger, and also depending on the process technology, the bipolar gain can be larger across the drain/FOX/source structure than across the drain/poly-gate/source structure. As we know, the ESD protection mechanism is largely bipolar action among the drain, substrate and source regions, and larger bipolar gain improves ESD performance.

Figure 9:
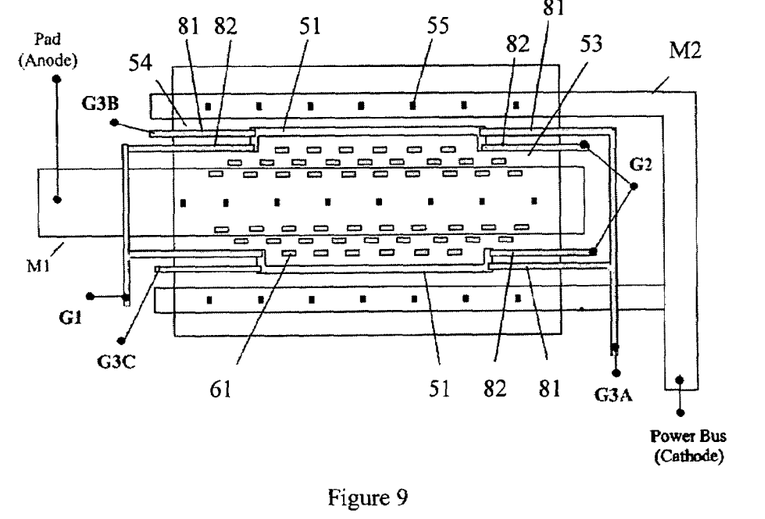
FIG. 9 shows islands can be placed in the drain region of the structure of FIG. 8.

FIG. 9 shows islands can be placed in the drain region 53 of the structure of FIG. 8, for more uniform ESD current dispite the discontinuity of the poly-gate element to the FOX gate stripe.

5. Islands:

For a reference of the formation of the island structure, please refer to U.S. Pat. No. 5,721,439 patent.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

PRIOR ARTS LISTED

1. "ESD in silicon Integrated Circuits," Amerasekera and Duvvury, John, Wiley and Sons, 1995.

2. U.S. Pat. No. 5,721,439 MOS transistor structure for electro-static discharge protection circuitry.

3. U.S. Pat. No. 5,248,892 Semiconductor device provided with a protection circuit.

4. U.S. Pat. No. 6,046,087 Fabrication of ESD protection device using a gate as a silicide blocking mask for a drain region.

5. U.S. Pat. No. 6,064,095 Layout design of electrostatic discharge protection device.

6. U.S. Pat. No. 6,153,913 Electrostatic discharge protection circuit.

7. U.S. Pat. No. 6,157,065 Electrostatic discharge protective circuit under conductive pad.

8. U.S. Pat. No. 6,236,073 Electrostatic discharge device.

What is claimed is:

1. An electrostatic discharge (ESD) protection device, comprising:
 a semiconductor bulk of a first conductivity type;
 a first doped region of a second conductivity type formed in said semiconductor bulk;
 a second doped region of a second conductivity type formed in said semiconductor bulk;
 a channel region formed between said first doped region and said second region, and said channel region comprises a first part, a second part and a third part;
wherein said first part and said third part are the different ends of said channel region, and said second part is located between said first part and said third part;
 a first gate segment formed only over a first part of said channel region;
 a first field-oxide stripe formed only over a second part of said channel region; and a first end of said first gate segment overlaps said first field-oxide stripe.

2. A device according to claim 1, wherein said first and second parts form a first continuous portion of said channel.

3. A device according to claim 1, wherein said first gate segment and said first field-oxide stripe are substantially collinear.

4. A device according to claim 1, wherein said first gate segment comprises a polysilsicon element over an oxide layer.

5. A device according to claim 1, further comprising a plurality of islands formed over said bulk and being encircled by said first doped region.

6. A device according to claim 5, wherein said plurality of islands comprises a first and second arrays of islands; said first array of islands comprises polysilicon-over-oxide islands; and said second array of islands comprises field-oxide islands.

7. A device according to claim 6, wherein said first array of islands is closer to said channel region than said second array of islands.

8. A device according to claim 7, further comprising a second gate segment formed over a third part of said channel region; and a first end of said second gate segment overlaps said first field-oxide stripe.

9. A device according to claim 8, wherein said second and third parts form a second continuous portion of said channel.

10. A device according to claim 1, wherein said first doped region couples to a pad.

11. A device according to claim 1, wherein said second doped region couples to a power bus.

12. A device according to claim 1, wherein said channel region comprising a split-channel region and a non-split-channel region; and further comprising a second gate segment;

said split channel region including a first and a second sub-channel regions spaced apart from each other; wherein said first sub-channel region being adjacent to said first doped region and second sub-channel region being adjacent to said second doped region;

said first gate segment formed over said first sub-channel region;

said second gate segment formed over said second sub-channel region;

said first field-oxide stripe formed over said non-split-channel region.

13. A device according to claim 12, wherein said first and said second gate segments are substantially parallel to each other.

14. A device according to claim 12, wherein said first gate segment, said second gate segment and said first field-oxide stripe are substantially parallel to each other.

15. A device according to claim 12, wherein said split channel region is connected to said non-split channel region to form a continuous channel region.

16. A device according to claim 12, wherein said first gate segment comprises a polysilicon element over an oxide layer.

17. A device according to claim 12, wherein said second gate segment comprises a polysilicon element over an oxide layer.

18. A device according to claim 12, wherein said first gate segment have a first end overlapping said first field-oxide stripe; and said second gate segment have a second end overlapping said first field-oxide stripe.

19. A device according to claim 12, further comprising a plurality of islands formed over said bulk and being encircled by said first doped region.

20. A device according to claim 12, wherein said first doped region coupling to a pad.

21. A device according to claim 12, wherein said second doped region coupling to a power bus.

22. An electrostatic discharge (ESD) protection device, comprising:

a semiconductor bulk of a first conductivity type;

a first doped region of second conductivity type formed in said semiconductor bulk;

a second doped region of a second conductivity type formed in said semiconductor bulk;

a channel region formed between said first and said second doped regions and said channel region comprises a first part, a second part and a third part, wherein said first part and said third part are the different ends of said channel region, and said second part is located between said first part, and said third part, a first gate segment formed only over a first part of said channel region;

a first field-oxide stripe formed only over a second part of said channel region;

a first end of said first gate segment overlaps said first field-oxide stripe;

a first and a second arrays of islands formed over said bulk and being encircled by said first doped region; wherein said first array of islands comprising polysilicon-over-oxide islands;

said second array of islands comprising field-oxide islands; and said first array of islands being closer to said channel region than said second array of islands.

* * * * *